(12) United States Patent
Kanbe et al.

(10) Patent No.: US 6,249,337 B1
(45) Date of Patent: Jun. 19, 2001

(54) ALIGNMENT MECHANISM AND PROCESS FOR LIGHT EXPOSURE

(75) Inventors: Keiichi Kanbe; Minoru Ujimasu, both of Tokyo (JP)

(73) Assignee: ORC Manufacturing Co., Tokyo (JP)

( * ) Notice: Subject to any disclaimer, the term of this patent is extended or adjusted under 35 U.S.C. 154(b) by 0 days.

(21) Appl. No.: 09/433,298

(22) Filed: Nov. 3, 1999

(51) Int. Cl.[7] ............................ G03B 27/42; G03B 27/58; G03B 27/62
(52) U.S. Cl. ................................ 355/75; 355/53; 355/72
(58) Field of Search .................................. 355/53, 72–77, 355/85, 91; 356/399

(56) References Cited

U.S. PATENT DOCUMENTS

| | | | |
|---|---|---|---|
| 4,576,475 | * | 3/1986 | Kitagawa et al. ............ 355/91 |
| 5,160,959 | * | 11/1992 | Everett et al. ............... 355/53 |
| 5,563,682 | * | 10/1996 | Akikawa et al. ............. 355/53 |

* cited by examiner

*Primary Examiner*—Russell Adams
*Assistant Examiner*—Hung Henry Nguyen
(74) *Attorney, Agent, or Firm*—Liniak, Berenato, Longacre & White (57) ABSTRACT

An alignment mechanism (A) for light exposure for use in a light exposure apparatus (1) having a transferring mechanism (2), which transfers a work; a light exposure table (3) which supports the work (W) and actuates in the vertical direction; an upper frame (9) placed on an upper side of the light exposure table, which supports a mask (M); and a vacuum absorption mechanism for bringing the work into contact with the mask when the light exposure table ascends is provided. The alignment mechanism has a pre-alignment mechanism (C) for pre-aligning the work on the light exposure table, and a mask alignment mechanism (D) for aligning the position of the mask to the position of the work. The pre-alignment mechanism (C) has concave grooves (6d) formed on the surface of the light exposure table at the side for placing the work; revolving portions (6a) placed on the circumferences of the light exposure table and moving along said concave grooves; supporting and pushing portions (6b) which support said revolving portions; and driving portions (6c) which actuates said supporting and pushing portions.

6 Claims, 10 Drawing Sheets

ALIGNMENT MECHANISM AND PROCESS FOR LIGHT EXPOSURE

FIELD OF THE INVENTION

The present invention relates to an alignment mechanism and an alignment process for light exposure, capable of adequately carrying out pre-alignment and alignment of works having a wide variety of thickness, i.e., from a thin plate work to a work having a prescribed thickness.

BACKGROUND OF THE INVENTION

Various alignment mechanisms for a light exposure apparatus for use in exposing a work have been suggested in conventional. For example, in the case where a work to be exposed is subjected to solder resist, the surface of the work is a very soft and delicate state and thus, is easy to undergo deformation and damage. When a work in such a delicate state, particularly in the case of a work in a thin film form, is transferred to carry out the light exposure, the transferring mechanism is required to be operated without coming any parts of the transferring mechanism in strongly contact with the work. For this reason, a forwarding transferring mechanism in which the rear surface of the work is caused to be in contact with a transferring belt or transferring rollers to be fed is used as a rule. However, as different from the transfer by the use of a handler, such a forwarding transferring mechanism cannot transfer the work at the state of keeping the work at a constant position and thus, the pre-alignment of the work must be carried out to adjust the position of the work until the alignment is carried out.

One example of such a construction is suggested in Japanese Patent Laid-Open No. 6-310393. To be specific, a light exposure apparatus disclosed therein is composed of a plurality of light exposure stages placed at prescribed gaps and means for moving a work, which is placed within the gaps. In this light exposure apparatus, at least one light exposure stage is placed in a movable manner, and the movable stage is moved to close the gaps at the time of carrying out light exposure.

The means for moving the work (including pre-alignment mechanism of the alignment mechanism) is composed of movable pins in X direction and movable pins in Y direction, which carry out pre-alignment of the work, and transferring belt for transferring the work.

According to this patent publication, it is said that by such a construction, since the work can be pre-aligned by positioning pins placed within the light exposure stages, it becomes suitable to carry out the alignment operation.

Another example of the prior art includes a light exposure process as suggested in Japanese Patent Laid-Open Publication No. 10-218353. This process comprises a step for placing a thin plate work on a top portion of a roller conveyer placed at an inlet side to transfer the work toward a light exposure portion; a step for receiving the transferring work by the top portion of a belt conveyer placed on a light exposure portion to transfer the work toward an upper portion of the light exposure table, a step for descending the belt conveyer to arrange the work on the upper surface of the light exposure table, a step for ascending the belt conveyer after the light exposure, to receive the work on the upper portion of the belt conveyer, and further ascending the belt conveyer to an upper portion of the light exposure table; a step for transferring the work thus ascended to place the work on the upper portion of the belt conveyer out of the light exposure portion; and a step for receiving the transferring work on an upper portion of a roller conveyer placed at an outlet side to transfer the work.

The light exposure table described therein possesses a center main table, and right and left side tables, positioned at both side of the main table in the direction parallel to the transferring direction. When the belt conveyer ascends or descends, the right and left side tables are separated from the main table.

Furthermore, after the work is received on the light exposure table, the pre-alignment mechanism, which pre-aligns the work, has sliding members placed on four corners of the work, which push the edge of the work. The sliding members move along the light exposure table to push the edges of the work, whereby the work is pre-aligned to the center portion. In the case where the work is in a thin plate from, air is blown from air-inlet pores placed on the entire surface of the light exposure table to pick up and float the work from the light exposure table in order to carry out the pre-alignment.

However, the alignment mechanisms and the alignment processes associated with the prior arts have the following problems:

(1) In the alignment mechanism having a construction that the gaps formed between the stages are closed by bringing the side stages into contact with the center stage, since positioning pins in X direction and in Y direction for carrying out pre-alignment are placed inside of the gaps, the pre-alignment can only be carried out when the stages are opened. After the pre-alignment is completed, the stages must be moved in order to close the gaps and, thus, there is a possibility that the work is unduly moved.

(2) In the alignment mechanism having a construction that the sliding members on the light exposure table which can be divided and assembled carry out the pre-alignment, when the work to be operated is a thin plate form, the sliding members cannot push the work in some cases. When the work which is floated by the air, blown from the air-inlet pores provided on the light exposure table is pre-aligned, the work sometimes has an adverse affect by the dust flown due to the air blown.

SUMMARY OF THE INVENTION

The present invention has been made in light of the above-situations, and an object of the present invention is to provide an alignment mechanism and an alignment process for light exposure, which can carry out adequate pre-alignment and adequate alignment, which can treat a work, even if it is a thin plate form, and which have an improved speed for operating a work without any adverse effect upon the work.

The object described above can be attained by one or any combination of first to fifth aspects of the present invention, which will be described later on:

A first aspect of the present invention is an alignment mechanism for light exposure for use in a light exposure apparatus having a transferring mechanism, which transfers a work; a light exposure table provided together with the transferring mechanism which supports the work and which actuates in the vertical direction; an upper frame placed on an upper side of the light exposure table, which supports a mask in order to project a pattern possessed by the mask; and a vacuum absorption mechanism for bringing the work into contact with the mask when the light exposure table ascends, said alignment mechanism for light exposure further possessing a pre-alignment mechanism for pre-aligning the work on said light exposure table, and a mask alignment mechanism for aligning the position of the mask to the position of the work; and said pre-alignment mechanism possessing concave grooves formed on the surface of the light exposure table at the side for placing the work; revolving portions placed on the circumferences of the light exposure table and moving along said concave grooves; supporting and pushing portions which support said revolving portions; and driving portions which actuates said supporting and pushing portions.

By such a configuration, since the revolving portions can move along the concave portions when the pre-alignment of a thin plate work is carried out, the edges of the work can be securely pushed. Furthermore, since the revolving portions, the supporting and pushing portions and the driving portions of the pre-alignment mechanism are placed outside of the light exposure table; the series of the operations, i.e., from the pre-alignment to the alignment can be smoothly carried out in a simple structure.

According to a second aspect of the present invention, the transferring mechanism has an arrangement mechanism, which arranges the work in the direction perpendicular to the direction of transferring the work at a portion of the transferring route of the transferring mechanism before the work is transferred to the light exposure table. According to a third aspect of the present invention, the arrangement mechanism has a supporting portion which picks up the work from the transferred position upwardly, revolving portions which come into contact with the work from the direction perpendicular to the direction of transferring the work to push the work, supporting portions which support the revolving portions, and driving portions which drive the revolving portions.

By such a configuration, since the edge portions of the work can be pushed by the revolving portions in the state where the work is picked up from the transferring mechanism by the supporting portions without heavy load, an adequate alignment operation can be carried out in a smooth manner. Furthermore, since the pre-alignment can be securely carried out, the alignment mechanism has good workability, i.e., the actuations can be minimized, leading to an improvement in the performance of operating the work.

According to a fourth aspect of the present invention, the upper frame has a light-transmitting frame which comes into contact with the mask, a supporting frame for the light-transmitting frame, and a cramp mechanism which pushes and fixes the supporting frame when the mask and the work are vacuum absorbed to each other, and which releases the fixation of the supporting frame when the position of the mask moves to be aligned.

By such a construction, the positions of the mask and the mask are never shifted, in the case where the mask is come into contact with the mark by vacuum adhesion, for example, in the case of taking a photograph by a camera, during the course of the light exposure.

According to the fifth aspect of the present invention, an alignment process in a light exposure apparatus is provided, which comprises:

a first step for receiving a work from the a transferring mechanism to a light exposure table, carrying out pre-alignment, allowing the work to come into contact with or nearly contact with the mask to be vacuum absorbed to each other by means of a vacuum absorption mechanism, and confirming the positions of the work and mask by a camera;

a second step for carrying out an alignment operation in which the position of the mask is aligned to the work when the relation between the positions of the work and the mask is out of an allowable level, and then moving a light source portion to carry out light exposure; or directly moving a light source portion to carry out light exposure when the relation between the positions of the work and the mask is within an allowable level and a third step for releasing the vacuum adhesion between the work and the mask and then returning the position of the mask to the original point, which is the position before the alignment is carried out, by means of the mask alignment mechanism to carry out an operation of returning to the original point.

By such a construction, even if the accuracy of the edges of the work is not constant, the images of the mask and the mark can be confirmed within the suitable view level of a camera for confirming the relation between the positions of the mask and the work.

DESCRIPTION OF THE PREFERRED EMBODIMENTS

Embodiments of the present invention will now be described by referring to the attached drawings.

Figure 1:
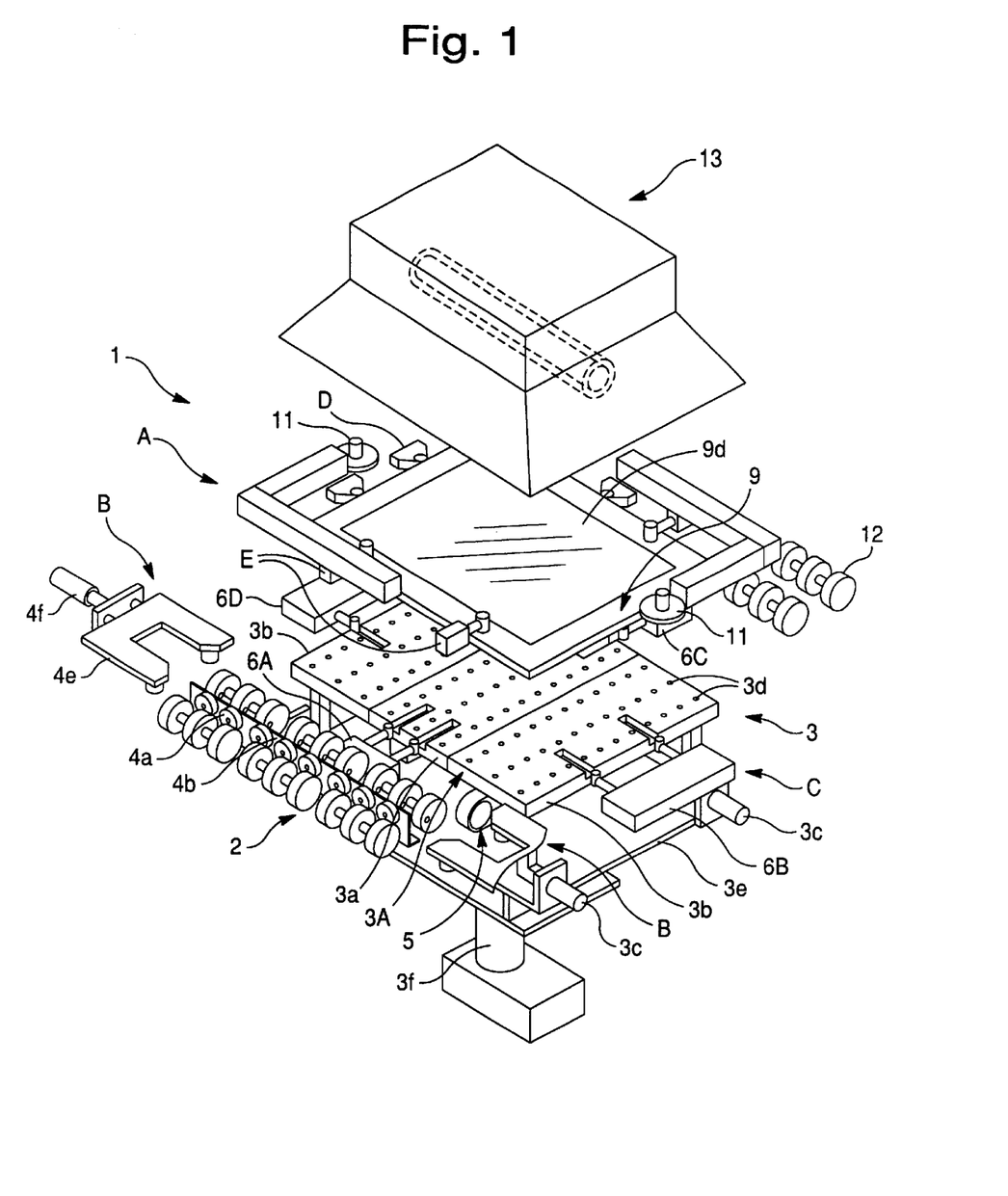
FIG. 1 is a perspective view showing a light exposure apparatus possessing an alignment mechanism for light exposure according to the present invention.
Figure 2:
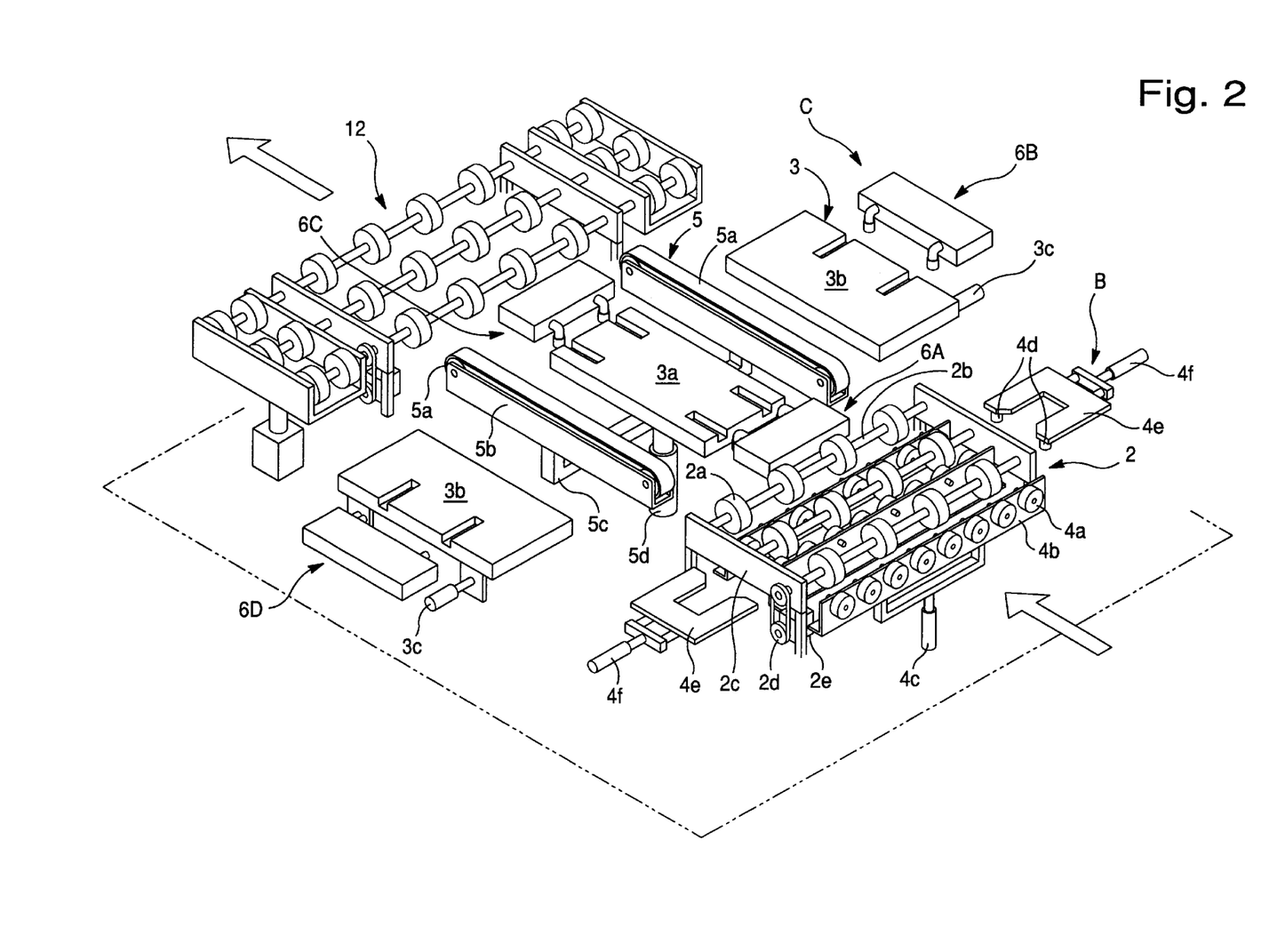
FIG. 2 is a perspective view showing the main portion of the transferring means and the main portion of the alignment mechanism.
Figure 3:
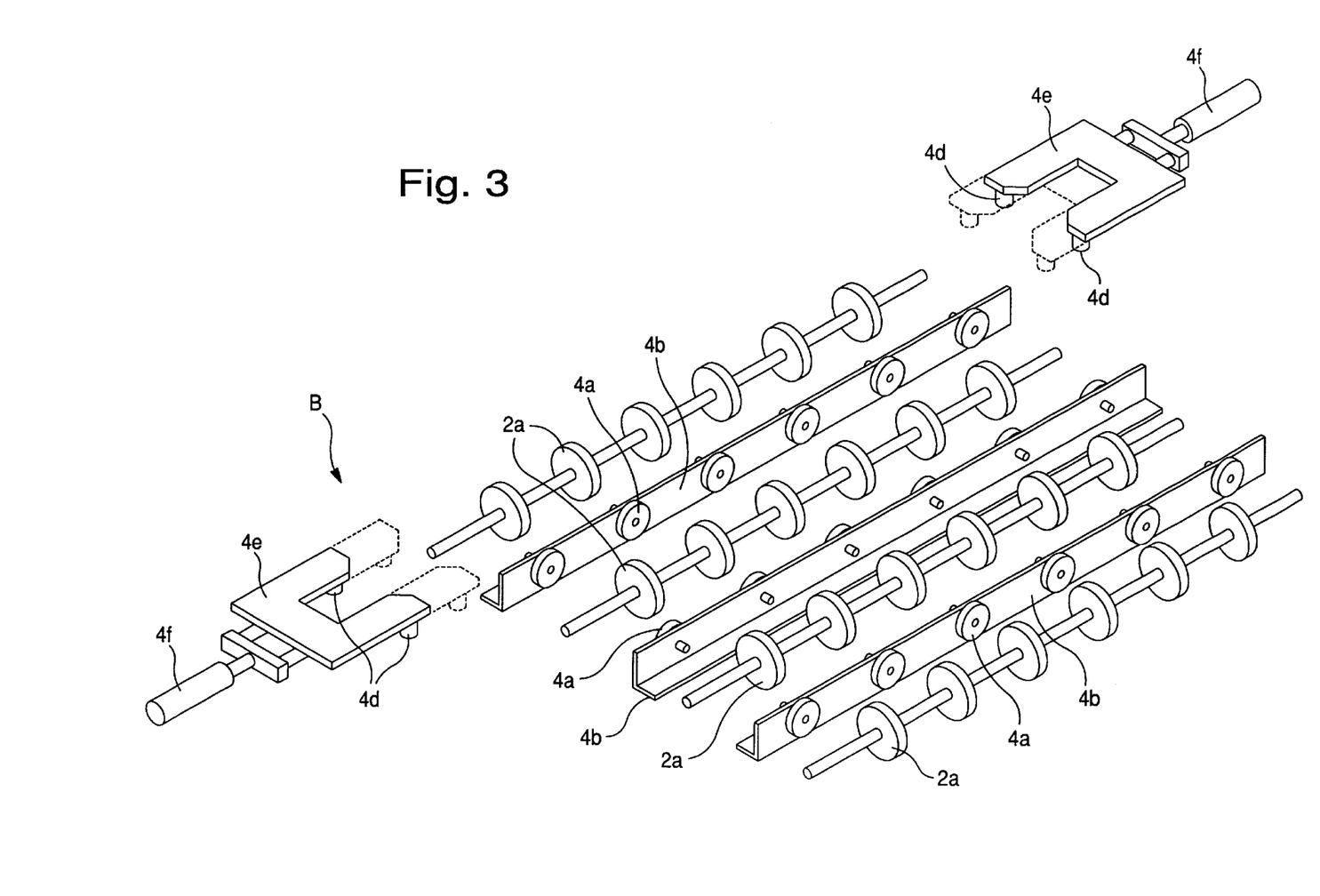
FIG. 3 is a perspective view showing the arrangement mechanism.

As shown in FIG. 1 to FIG. 3, a light exposure apparatus 1 having an alignment mechanism A for light exposure of the present invention is mainly composed of a transferring mechanism 2 for transferring a work W, an arrangement mechanism B placed at a prescribed portion of the transferring mechanism 2, a light exposure table 3 provided together with the transferring mechanism 2, four pre-alignment mechanisms C each provided on one side of the four sides of the light exposure table 3, an upper frame 9 for supporting a mask M, provided on an upper portion of the light exposure table 3, a cramp mechanism E provided on the upper frame 9, a light source portion 13, provided on an upper portion of the upper frame 9, and a carrying mechanism 12 provided adjacent to the light exposure table 3.

The alignment mechanism A for light exposure at least possesses a pre-alignment mechanism C, a mask alignment mechanism D for aligning the mask M, provided on an upper portion of the light exposure table 3. In figures, the alignment mechanism A for light exposure is composed of the arrangement mechanism B provided at a prescribed portion of the transferring mechanism 2 of the light exposure apparatus A, and a cramp mechanism E for supporting the mask M, provided around the upper frame 9.

As shown FIG. 2 and FIG. 3, the arrangement mechanism B is placed at a portion of the end of the movement of the transferring mechanism 2 at which the work W is delivered to the light exposure table 3. The arrangement mechanism B is composed of supporting rollers 4a, serving as a supporting portion, provided between the transferring rollers 2 of the transferring mechanism 2, supporting legs 4b for supporting these supporting rollers 4a in a rotatable manner, driving portions 4c for vertically moving the supporting legs 4b, revolving portions 4d which come into contact with the edge surfaces of the work W supported by the supporting rollers 4a, pushing portions 4e for supporting the revolving portions 4d, and shifting portions 4f which horizontally move the pushing portions 4e. The transferring mechanism 2 is composed of transferring rollers 2a, a rotating shaft 2b of the transferring rollers 2a, a supporting portion 2c for supporting the rotating shaft 2b in a rotatable manner, a driving motor 2e which drives the rotating shaft 2b via a transmitting portion 2d.

Figure 5A:
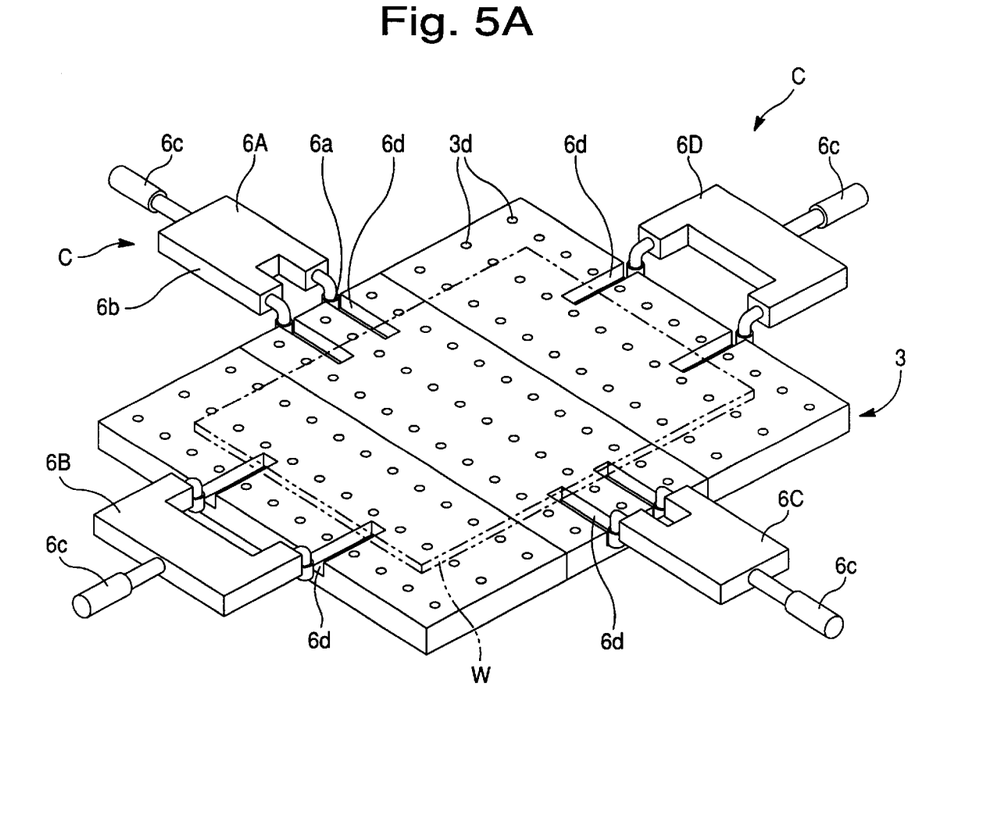
FIG. 5A and FIG. 5B are a perspective view and a partially cutaway view showing a pre-alignment mechanism.
Figure 5B:
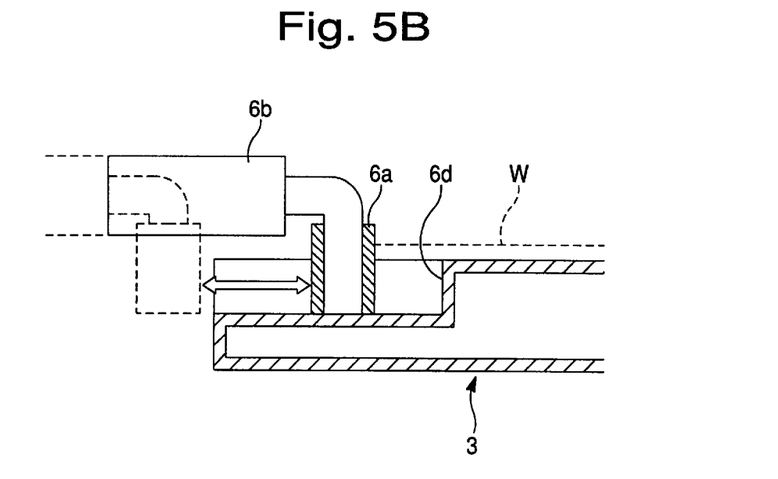
Figure 6:
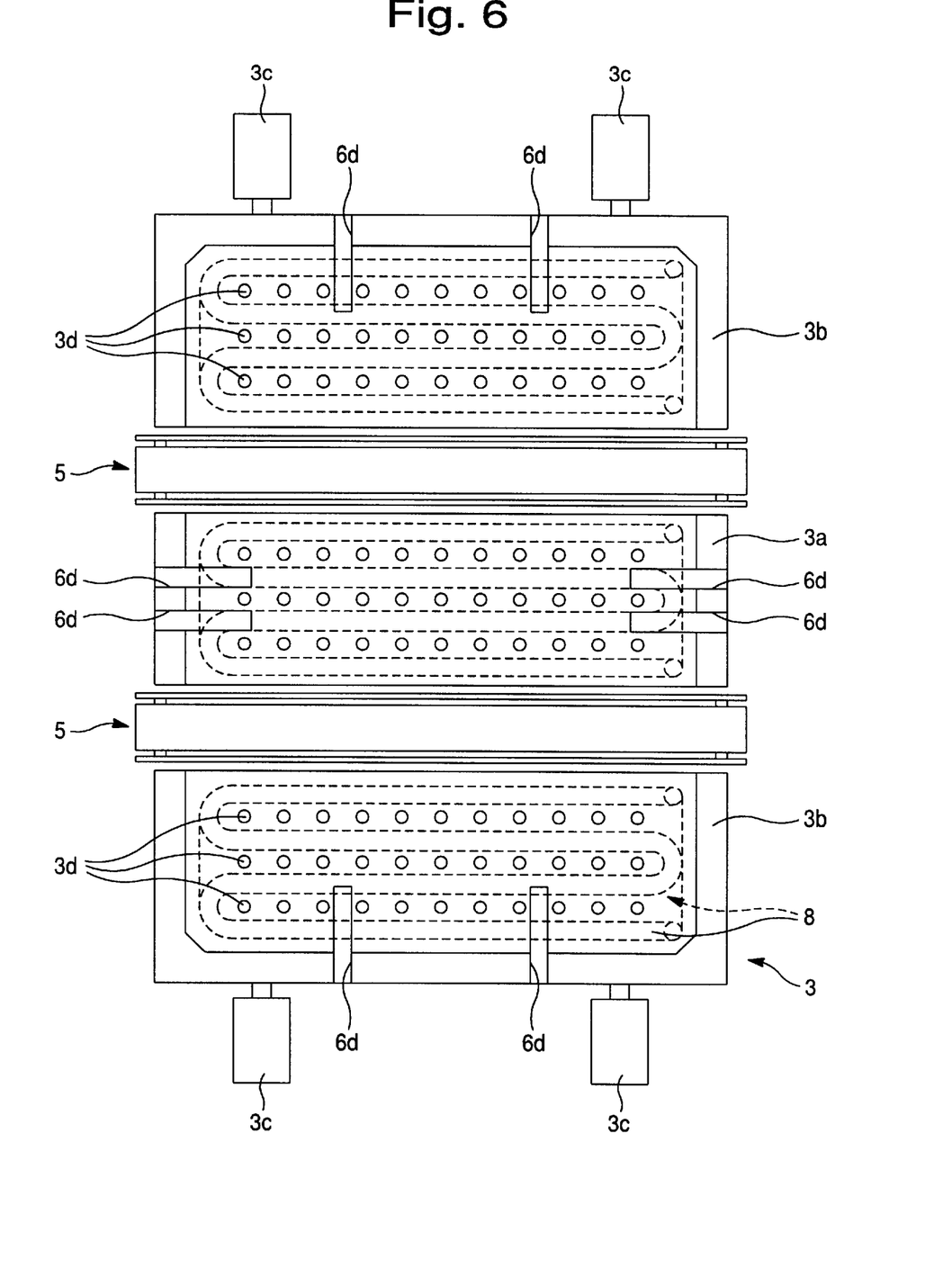
FIG. 6 is a plane view showing the cooling mechanism of the light exposure table.

As shown in FIG. 1, FIG. 5, and FIG. 6, the light exposure table 3 is composed of a table 3A for placing the work W, a frame 3e for supporting the table 3A, and a elevating cylinder device 3f for vertically moving the frame 3e. The table 3A is composed of a central main table 3a, right and left side tables 3b and 3b. The side tables 3b and 3b are configured so as to come in contact with the center main table 3a and as to be separated from the center main table 3a by means of side cylinder devices 3c and 3c each placed on the side of the frame 3e. The frame 3e supports a delivery and receiving mechanism 5 as described later on in a manner such that the delivery and receiving mechanism 5 is movable in vertical directions.

The side cylinder devices 3c and 3c are provided for the purpose of bringing the right and left side tables 3b and 3b into contact with the main table 3a and allowing the right and left side tables 3b and 3b to be separated from the main table 3a. These side cylinder devices 3c and 3c are configured such that the right and left side tables 3b and 3b are subjected to be in compact with the main table 3a or to be separated from the main table 3a, when the transferring belts 5a and 5a of the delivery and receiving mechanism 5 as described later on ascend or descend.

For the purpose of driving the side cylinder devices 3c and 3c, the elevating cylinder device 3f, limit switches (not shown) for detecting the situation of the driving portions, electronic valves for controlling the supply and discharge of a moving media for driving (air or oil) (the case of transferring screw, and endless belt being excluded), and the like are provided. Cooperated with a sensor (not shown) for detecting the position of the work to be moved, these limit switches and electronic valves are configured to automatically execute the operation of transferring of the work.

As shown in FIG. 6, the main table 3a and side tables 3b and 3b have hallow construction in which multiple pores 3d for air inlet are formed on the surfaces at the side of directly contact with the work W, and cooling tubes 8 for circulating a cooling media are embedded therein. Each of the cooling tubes 8 is placed in a zigzag line within the hallow portion in such a state that the cooling tube 8 is in contact with the internal surface of the table at the side of placing the work.

As shown in FIG. 2, the delivery and receiving mechanism 5 which is supported by the frame 3e at a lower portion of the table 3A is composed of transferring belts 5a and 5a for delivering or receiving the work W, supporting frames 5b and 5b for supporting these transferring belts 5a and 5a in a rotatable manner, a holding arm 5 for holding the supporting frames 5b and 5b, and driving cylinder 5d for supporting the holding arm 5c in a vertically movable manner.

The delivery and receiving mechanism 5 is constructed so that when the table 3A can be divided by the side cylinders 3c whereby the main table 3a is separated from side tables 3b and 3b, the transferring belts 5a and 5a project from the gaps generated by the separation of the tables toward upper portions of the table 3A. The transferring belts 5a and 5a thus projected has such heights as to match the transferring the work W from the transferring mechanism 2 toward the transferring mechanism 12.

As shown in FIG. 1, FIG. 5A, and FIG. 5B, the pre-alignment mechanisms C are positioned around the light exposure table 3 in order to carry out the pre-alignment of the work W. These pre-alignment mechanisms C are composed of pushing devices 6A, 6B, 6C, and 6D placed on four sides of the table 3A. Together with the concave grooves 6d and 6d formed from each side of the light exposure table 3 toward the center of the light exposure table 3, these pushing devices 6A, 6B, 6C, and 6D perform the pre-alignment of the work W. Each of the pushing devices 6A, 6B, 6C, and 6D possesses revolving portions 6a and 6a which move along the concave grooves 6d and 6d, a supporting and pushing portion 6b which supports the revolving portions 6a and 6a, and a driving portion 6c which drives the supporting and pushing portion 6b.

As shown in FIG. 5A, a plurality of concave grooves 6d (two grooves in the figure) are formed on the light exposure table 3 each in the direction perpendicular to the edge surface of the work W, and the concave grooves 6d on each side are formed to be parallel to each other. As shown in FIG. 5B, the revolving portion 6a is supported by the supporting and pushing pin 6b in a rotatable manner when the revolving portion 6a comes into contact with the work W to move the work W. For this reason, even if the distances between the revolving portions 6a and the edge surfaces of the respective work W are different from each other in each side when the revolving portions in each of the directions push the work W, the work W can be pre-aligned in an adequate manner.

Figure 7:
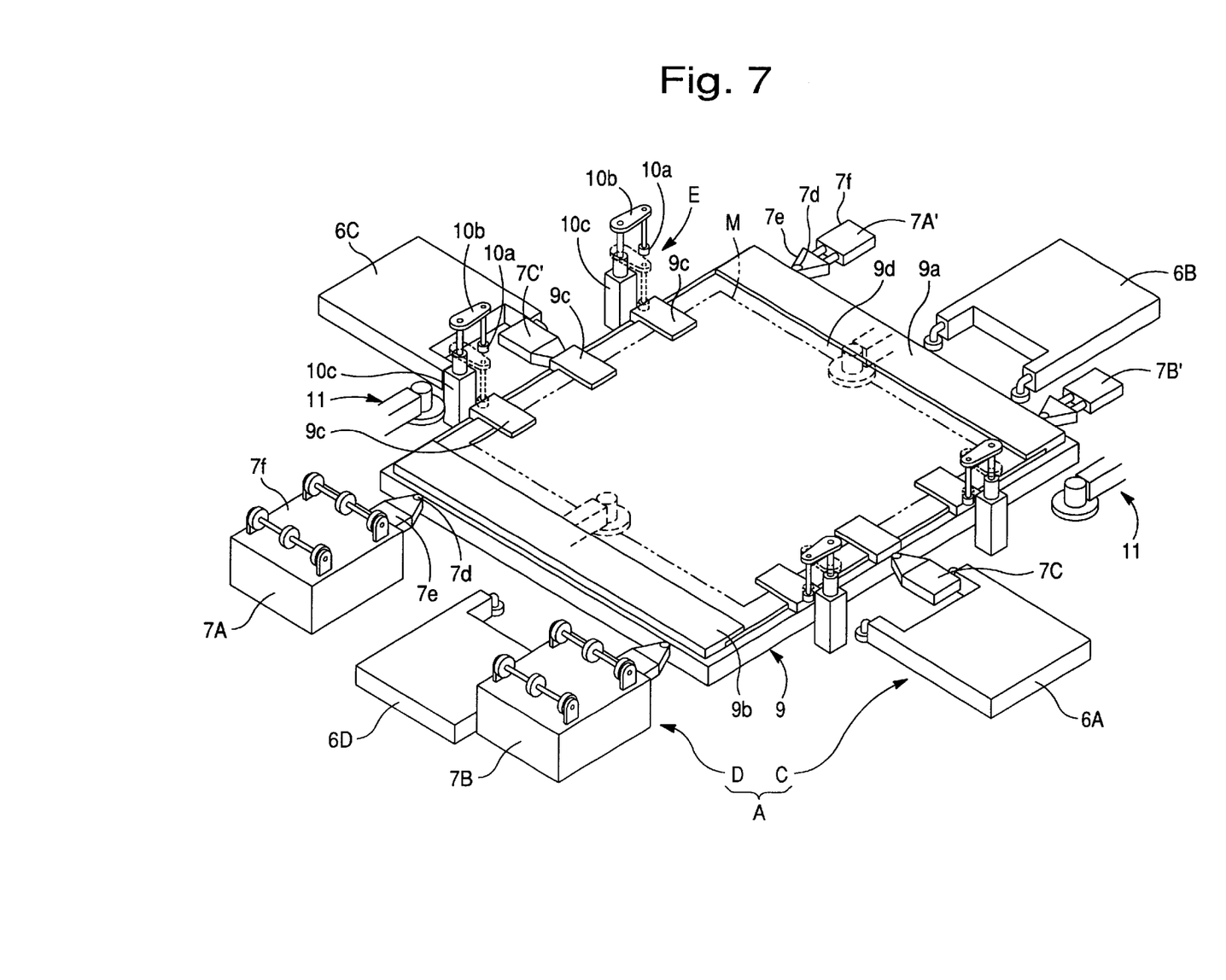
FIG. 7 is a perspective view showing a mask alignment mechanism and a cramp mechanism.

As shown in FIG. 7, the upper frame 7 for supporting the mask M possesses a light transmitting plate 9d which is brought into contact with the mask M to support the mask M, a frame 9a which supports the light transmitting plate 9d, and a supporting frame 9b which supports the frame 9b in the horizontal direction in a rotatable manner via a rotatably supporting portion (not shown). The frame 9a is configured to have a tip 9c at a prescribed circumference portion so that a cramp mechanism E for fixing the frame 9a can be provided.

As shown in FIG. 7, the cramp mechanism E is composed of a cramp head 10a which comes into contact with the tip 9c of the frame 9a, a supporting arm 10b which supports the cramp head 10b, and a drive device 10c, which vertically moves the supporting arm 10b and which rotates the supporting arm 10b from an ideal line to a real line as depicted on the figure.

The cramp mechanism E terminates the pushing actuation in the case where the position of the mask M is moved by the mask alignment mechanism D.

Also, as shown in FIG. 7, the mask alignment mechanism D for aligning the position of the mask M to the position of the work W possesses pushing mechanisms 7A, 7B, and 7C, which push the frame 9a from respective sides, coupled driving mechanism 7A', 7B', and 7C' placed opposite the pushing mechanisms 7A, 7B, and 7C, respectively. The pushing mechanisms 7A and 7B are placed on the same one side of the frame 9a, and the pushing mechanism 7C is placed at the central portion of the side adjacent to the side on which the pushing portions 7A and 7B are placed.

The pushing mechanism 7A (7B, or 7C) is composed of a revolving portion 7a, which comes into contact with one side of the frame 9a in a rotatable manner, a supporting and pushing portion 7b, which supports the revolving portion 7a, and a driving portion 7c, which drives the supporting and pushing portion 7b. The coupled driving portion 7A' (7B' or 7C') is composed of a revolving portion 7d, which comes into contact with the frame 9a at the position opposite the pushing mechanism 7A (7B, or 7C) in a rotatable manner, a supporting and coupled driving portion 7e, which supports the revolving portion 7d, and an elastic portion 7f which supports the supporting and coupled driving portion 7e against the pushing force of the pushing mechanism 7A (7B, or 7C).

As shown in FIG. 1, a light source portion 13 which irradiates a light including a ultraviolet light and which is composed of a discharge lamp and a reflecting mirror is placed on an upper portion of the upper frame 9. At the position of the discharge lamp, a shutter (not shown), which surrounds the discharge lamp and which blocks the irradiation of the light, may optionally be provided.

The functions of the alignment mechanism A for light exposure and the light exposure apparatus 1 will now be described. As shown in FIG. 2 and FIG. 4, when the work W is placed on the transferring rollers of the transferring mechanism 2, the work W is transferred to the side of the light exposure table 3 and then stopped at the terminal of the transferring mechanism 3.

Figure 4A:
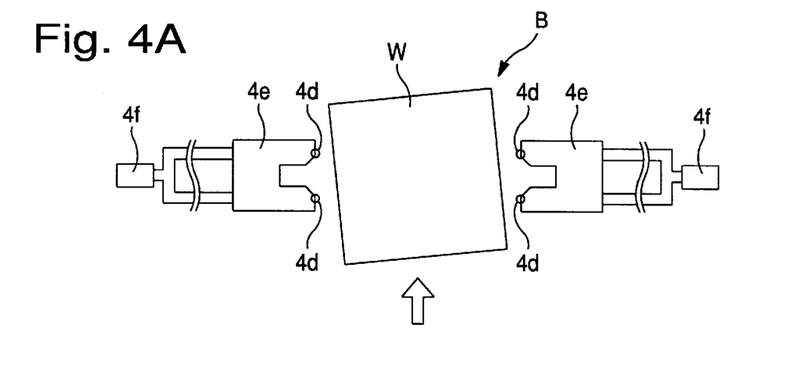
FIG. 4A, FIG. 4B, FIG. 4C, and FIG. 4D are explanatory views showing the actuation of the arrangement mechanism.
Figure 4B:
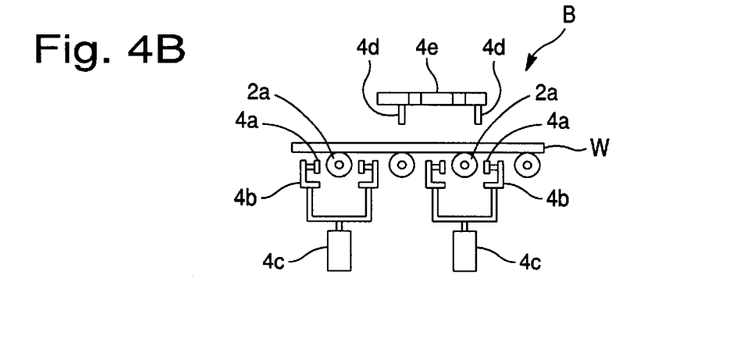
Figure 4C:
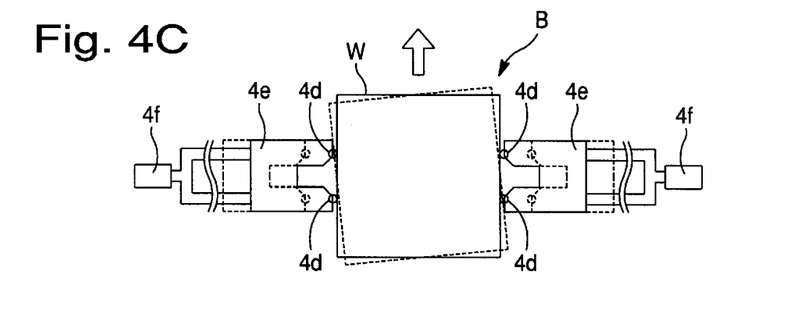
Figure 4D:
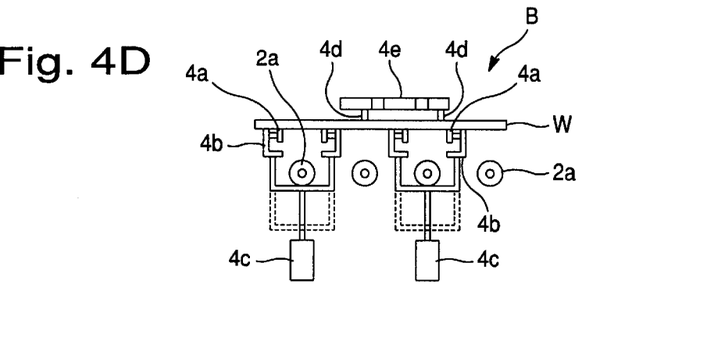

When the work is transferred to a prescribed position by means of the transferring rollers 2a and stopped as shown in FIG. 4A and FIG. 4B, the supporting roller 4a ascends by the driving portion 4c, the work W is picked up and floated from the transferring roller 2a as shown in FIG. 4C and 4D. In this state, when the supporting and pushing portion 4e is moved to the side of the work W by means of the shifting portion 4f, whereby the revolving portion 4d is come into contact with the edge side of the work W. This allows the work W to be arranged to the direction perpendicular to the transferring direction.

When the work W is arranged by means of the arrangement mechanism B as described above, the work W thus arranged is delivered to the light exposure table 3 by means of the receiving and delivering mechanism 5.

Figure 8A:
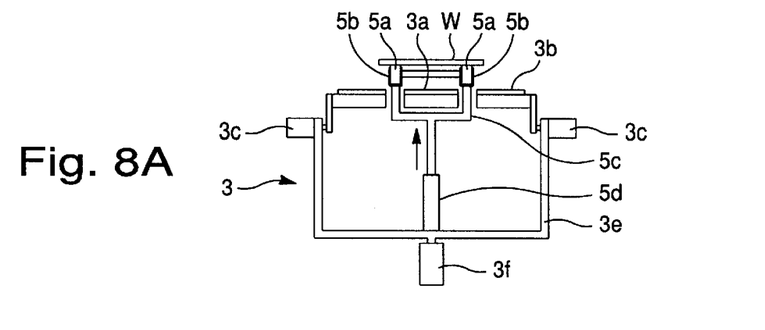
FIG. 8A, FIG. 8B, FIG. 8C, and FIG. 8D are explanatory views showing a series actuations from receiving the work from the transferring mechanism to carrying out the pre-alignment.

To be specific, as shown in FIG. 2 and FIG. 8A, by the actuation of the side cylinders 3c and 3c, the side tables 3b and 3b are caused to be separated from the main table 3a, and by the actuation of the driving cylinder 5d the transferring belts 5a and 5a ascend between the main table and the side tables, just separated, whereby the position of the work W to be transferred is adjusted, and then the work W is received from the transferring rollers 2a by the transferring belts 5a and 5b.

Figure 8B:
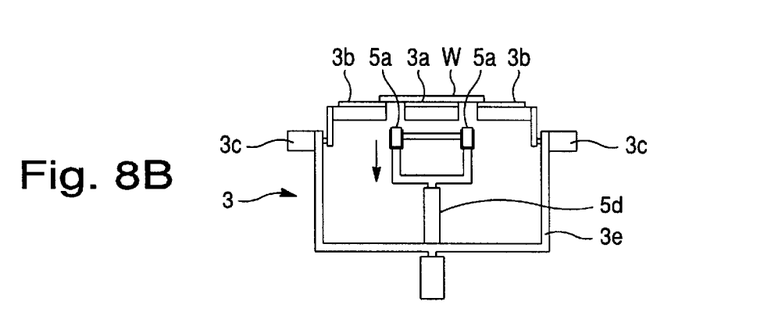
Figure 8C:
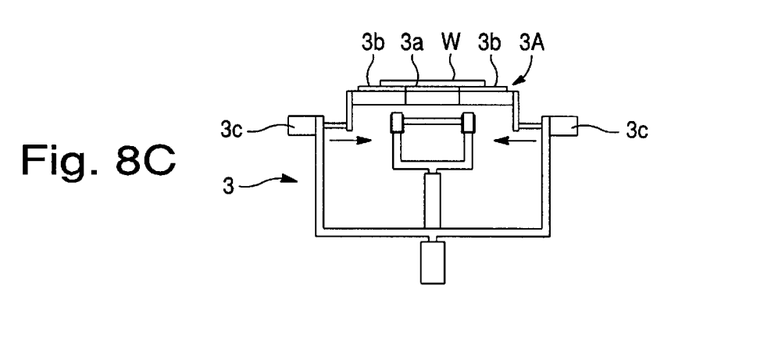

When the work W is received by the transferring belts 5a and 5b, the work is moved to the center of the transferring belts 5a and 5b. Subsequently, as shown in FIG. 8B, the transferring belts 5a and 5b descend by the actuation of the driving cylinder 5d to deliver the work W to the main table 3a and side tables 3b and 3b. As shown in FIG. 8C, the side cylinders 3c and 3c are actuated to bring the side tables 3b and 3b into contact with the main table 3a to thereby place the work W on the table 3A.

Figure 8D:
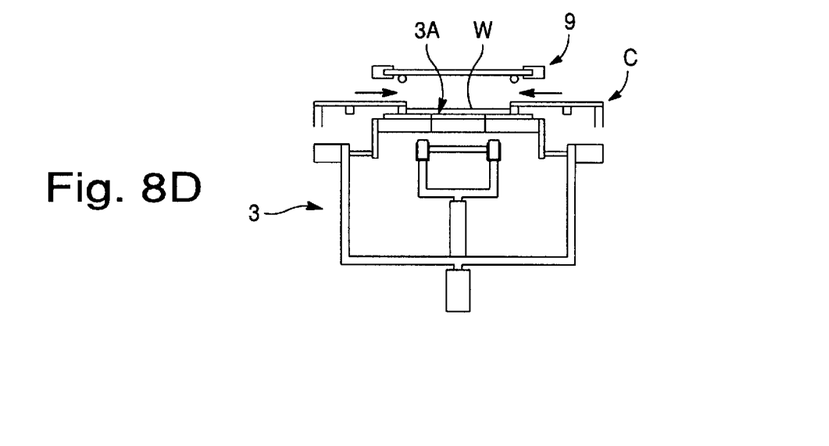

Furthermore, as shown in FIG. 8D, when the work W is placed on the table 3A, the pre-alignment mechanism C is driven. To be specific, as shown in FIGS. 5A and 5B, pushing devices 6A, 6B, 6C and 6D placed on the four sides of the table 3A actuate and move the rotating portions 6a along the concave grooves 6d to push the four edge sides of the work W. This carries out the pre-alignment of the work W.

At this time, the revolving portions 6a in the state of being embedded within the concave grooves 6d push the edge surfaces of the work. Consequently, even in the case of being applied to a thin plate work as the work W to be exposed, an adequate pre-alignment can be carried out.

Figure 9A:
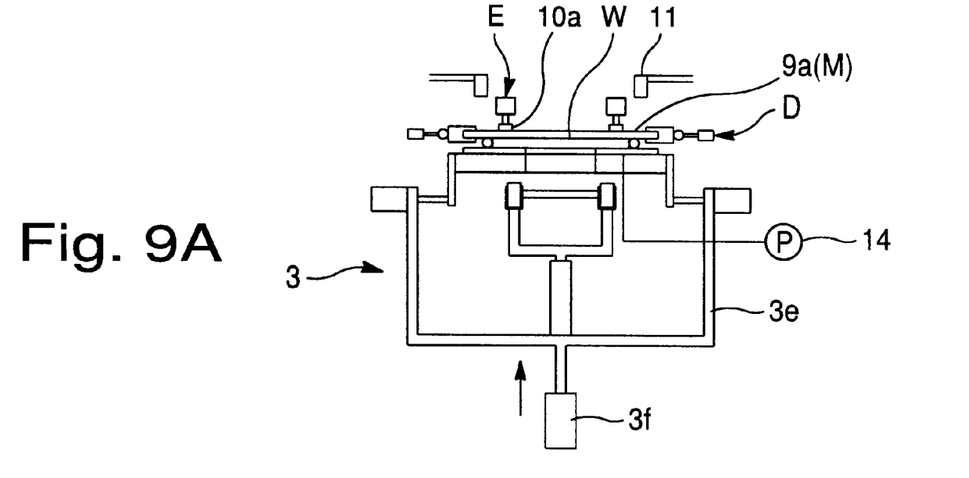
FIG. 9A, FIG. 9B, FIG. 9C, and FIG. 9D are explanatory views showing a series actuations from carrying out vacuum absorption between the work and the mask to carry out alignment to completing the light exposure.

As shown in FIG. 9A and FIG. 1, when the pre-alignment is finished, the elevating cylinder device 3f actuate to cause the frame 3e to ascend, whereby the table 3A on which the work W is placed ascends to bring the work W into contact or nearly contact with the mask M placed on the upper frame 9, and the work W and the mask M are absorbed to each other by the vacuum absorption mechanism 14. In this state, as shown in FIG. 9A, the marks for the positioning the work W and the mask M (not shown) are confirmed by CCD cameras 11 and 11, which are cameras, and the amount of the shear in the positions are calculated by a processing control unit (not shown). At this time, the cramp mechanism E pushes the frame 6a to fix the position of the mask.

Figure 9B:
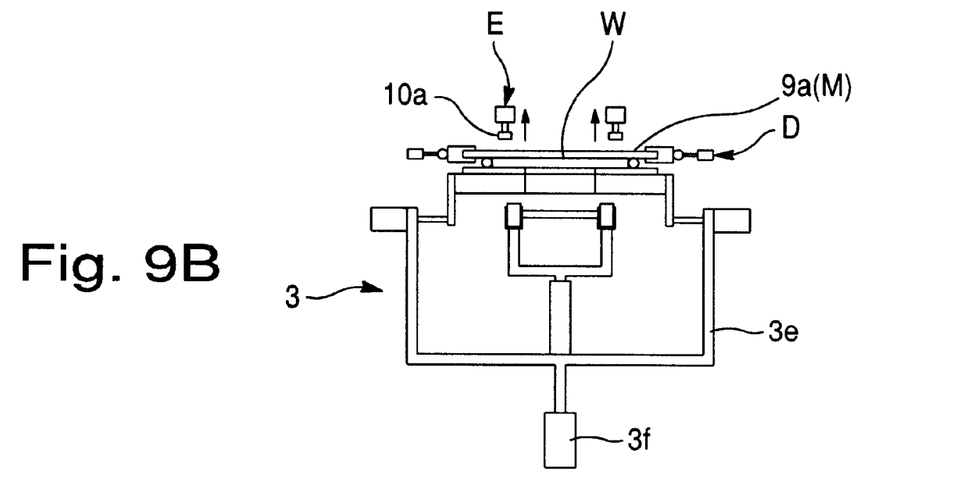

When the amount of the shear in the positions of the mask M and the work M is calculated, the mask alignment mechanism D is actuated by a signal from the processing control unit (not shown). To be specific, as shown in FIG. 7, and FIG. 9B, any one or combination of the pushing mechanisms 7A, 7B, and 7C, which is (are) required, is(are) actuated to move the mask M in the horizontal direction of X-direction, Y-direction, and also 0direction to carry out the alignment At this time, the cramp head 10a is moved to release the pushing actuation.

Figure 9C:
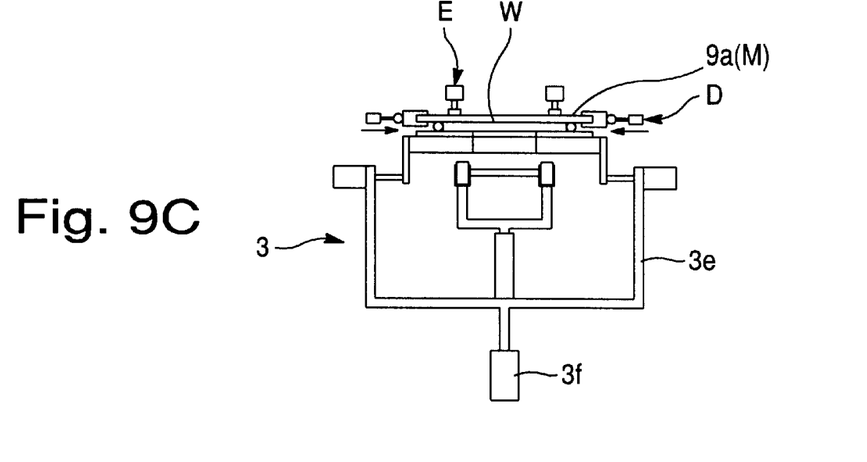

After the alignment is completed, the alignment conditions of the positioning marks of the mask M and the work W are again confirmed by the CCD cameras 11 and 11. If the conditions are within an allowable level, a light containing an ultraviolet light having a prescribed wavelength is irradiated from the light source portion 13, as shown in FIG. 9 to expose the pattern on the mask to the work W. During the light exposure described above, the cramp mechanism E pushes the frame 9a of the mask to be fixed.

After the light exposure is completed, the vacuum absorption between the mask M and the work W is released, and the frame 3e descends by the actuation of the elevating cylinder device 3f whereby the work W placed on the table 3A descends. Further, the work W having been exposed is delivered to the carrying mechanism 12 by means of the transferring belts 5a and 5a (see FIG. 1).

When the work W, which is separated from the mask M, descends, the mask M is moved to the position before the mask M is moved (original position) by means of the alignment mechanism D on the basis of the signal from the processing control portion (not shown) (returning to the original point). This is the reason why in the case where the accuracy of the edge surfaces of the work W is lower than a prescribed level, even if the subsequent positioning marks of the work W and the mask M are confirmed by the CCD cameras as in the state where the position of the mask M after the alignment is cause to have a shear from to the preset position (original position), the positioning marks of the work W and the mask M cannot be confirmed by the CCD cameras in some cases. In the case where the accuracy of the edge surfaces of the work W may be assumed to be good, it is not required to carry out the returning to the original point.

Figure 9D:
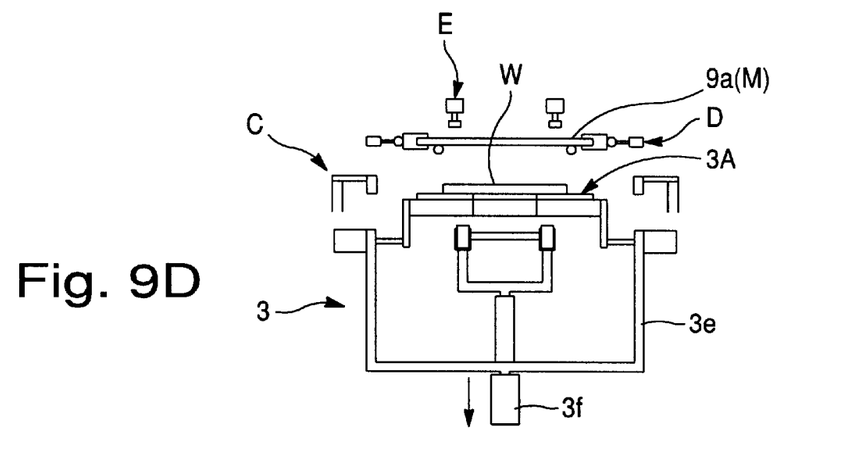

As shown in FIG. 9D, when the mask M is returned to the original point, the cramp mechanism E is released to the pushing force of the cramp mechanism E toward the frame 9a. After the mask M is returned to the original point, the frame 9a of the mask M is fixed by the cramp mechanism E.

While the invention has been described in detail and with reference to specific embodiments thereof, it will be apparent to one skilled in the art that various changes and modifications can be made therein without departing from the spirit and scope thereof For example, in the case where external size of the work is small enough or the thickness of the work is large enough, the light exposure table may be one sheet instead of the dividing type.

What is claimed is:

1. An alignment mechanism for light exposure for use in a light exposure apparatus having a transferring mechanism, which transfers a work; a light exposure table provided together with the transferring mechanism which supports the work and which actuates in the vertical direction; an upper frame placed on an upper side of the light exposure table, which supports a mask in order to project a pattern possessed by the mask; and a vacuum absorption mechanism for bringing the work into contact with the mask when the light exposure table ascends, said alignment mechanism for light exposure further possessing a pre-alignment mechanism for pre-aligning the work on said light exposure table, and a mask alignment mechanism for aligning the position of the mask to the position of the work; and said pre-alignment mechanism possessing concave grooves formed on the surface of the light exposure table at the side for placing the work; revolving portions placed on the circumferences of the light exposure table and moving along said concave grooves; supporting and pushing portions which support said revolving portions; and driving portions which actuates said supporting and pushing portions.

2. The alignment mechanism as claimed in claim 1, wherein said transferring mechanism has an arrangement mechanism which arranges the work in the direction perpendicular to the direction of transferring the work at a portion of the transferring route of the transferring mechanism before the work is transferred to the light exposure table.

3. The alignment mechanism as claimed in claim 2, wherein said arrangement mechanism has a supporting portion which picks up the work from the transferred position upwardly, revolving portions which come into contact with the work from the direction perpendicular to the direction of transferring the work to push the work, supporting portions which support the revolving portions, and driving portions which drive the revolving portions.

4. The alignment mechanism as claimed in claim 1, wherein the upper frame has a light-transmitting frame which comes into contact with the mask, a supporting frame for the light-transmitting frame, and a cramp mechanism which pushes and fixes the supporting frame when the mask and the work are vacuum absorbed to each other, and which releases the fixation of the supporting frame when the position of the mask moves to be aligned.

5. The alignment mechanism as claimed in claim 2, wherein the upper frame has a light-transmitting frame which comes into contact with the mask, a supporting frame for the light-transmitting frame, and a cramp mechanism which pushes and fixes the supporting frame when the mask and the work are vacuum absorbed to each other, and which releases the fixation of the supporting frame when the position of the mask moves to be aligned.

6. The alignment mechanism as claimed in claim 3, wherein the upper frame has a light-transmitting frame which comes into contact with the mask, a supporting frame for the light-transmitting frame, and a cramp mechanism which pushes and fixes the supporting frame when the mask and the work are vacuum absorbed to each other, and which releases the fixation of the supporting frame when the position of the mask moves to be aligned.

* * * * *